(12) United States Patent
Shiao et al.

(10) Patent No.: US 9,536,964 B2
(45) Date of Patent: Jan. 3, 2017

(54) METHOD FOR FORMING VIA PROFILE OF INTERCONNECT STRUCTURE OF SEMICONDUCTOR DEVICE STRUCTURE

(71) Applicant: TAIWAN SEMICONDUCTOR MANUFACTURING CO., LTD., Hsin-Chu (TW)

(72) Inventors: Wei-Yin Shiao, Taichung (TW); Che-Cheng Chang, New Taipei (TW); Tai-Shin Cheng, Hsinchu (TW); Wei-Ting Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/725,002

(22) Filed: May 29, 2015

(65) Prior Publication Data

US 2016/0351669 A1 Dec. 1, 2016

(51) Int. Cl.
*H01L 29/41* (2006.01)
*H01L 29/417* (2006.01)
*H01L 29/66* (2006.01)
*H01L 21/768* (2006.01)

(52) U.S. Cl.
CPC ..... *H01L 29/4175* (2013.01); *H01L 21/76805* (2013.01); *H01L 21/76811* (2013.01); *H01L 21/76816* (2013.01); *H01L 21/76877* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 7,232,762 B2* | 6/2007 | Chang | H01L 21/0276 216/46 |
| 8,883,648 B1* | 11/2014 | Hsieh | H01L 21/76802 257/E23.011 |
| 2004/0234894 A1* | 11/2004 | Kirmse | H01L 21/31116 430/311 |
| 2005/0054192 A1* | 3/2005 | Kang | H01L 21/76804 438/629 |
| 2005/0106882 A1* | 5/2005 | Chao | H01L 21/76816 438/700 |

(Continued)

*Primary Examiner* — Evren Seven
*Assistant Examiner* — Alia Sabur
(74) *Attorney, Agent, or Firm* — Slater Matsil, LLP

(57) ABSTRACT

A method for forming the semiconductor device structure is provided. The method includes forming a first metal layer over a substrate and forming a dielectric layer over the first metal layer. The method includes forming an antireflection layer over the dielectric layer, forming a hard mask layer over the antireflection layer and forming a patterned photoresist layer over the hard mask layer. The method includes etching a portion of the antireflection layer by performing a first etching process and etching through the antireflection layer and etching a portion of the dielectric layer by performing a second etching process. The method includes etching through the dielectric layer by performing a third etching process to form a via portion on the first metal layer. The via portion includes a first sidewall and a second sidewall, and the slope of the first sidewall is different from that of the second sidewall.

20 Claims, 16 Drawing Sheets

(56) References Cited

U.S. PATENT DOCUMENTS

| | | | |
|---|---|---|---|
| 2009/0191711 A1* | 7/2009 | Rui .......................... | G03F 7/40 438/695 |
| 2013/0242633 A1* | 9/2013 | Liaw ..................... | G11C 17/12 365/72 |
| 2014/0061917 A1* | 3/2014 | Kim ..................... | H01L 23/528 257/751 |
| 2016/0056154 A1* | 2/2016 | Watanabe ........... | H01L 27/0886 257/401 |

* cited by examiner

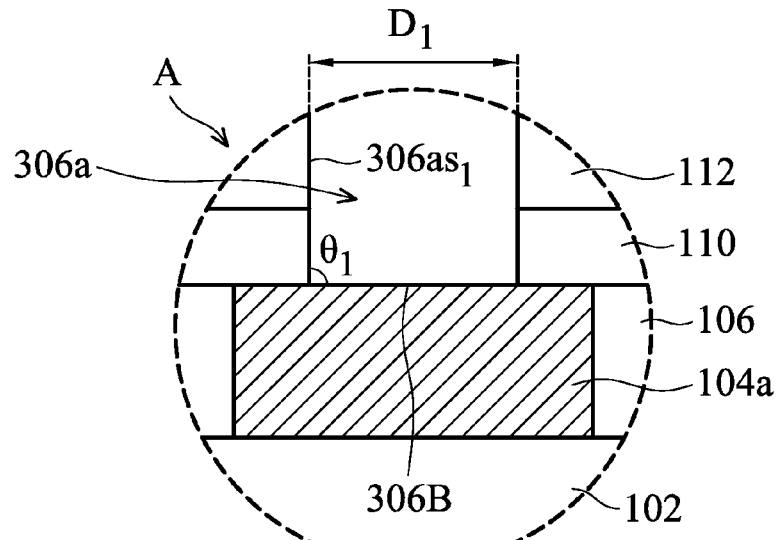
FIG. 3L'
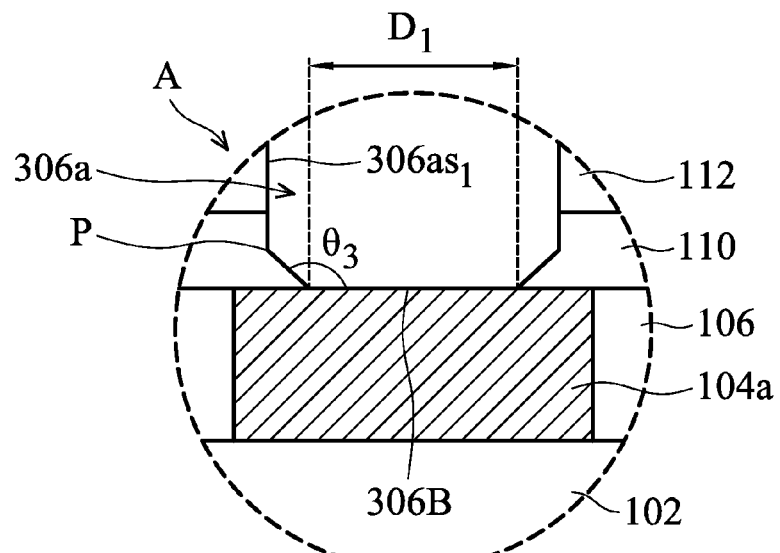
FIG. 3L"

METHOD FOR FORMING VIA PROFILE OF INTERCONNECT STRUCTURE OF SEMICONDUCTOR DEVICE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the fabrication of semiconductor devices, the size of semiconductor devices has been continuously reduced in order to increase device density. Accordingly, a multi-layered interconnect structure is provided. The interconnect structure may include one or more conductive lines and via layers.

Although existing interconnect structures and methods of fabricating interconnect structures have been generally adequate for their intended purposes, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3L' shows an enlarged view of a region A of FIG. 3L, in accordance with some embodiments of the disclosure.

FIG. 3L" shows an enlarged view of a region A of FIG. 3L, in accordance with other embodiments of the disclosure.

FIG. 4A' shows an enlarged view of a region B of FIG. 4A, in accordance with some embodiments of the disclosure.

DETAILED DESCRIPTION

Figure 1:
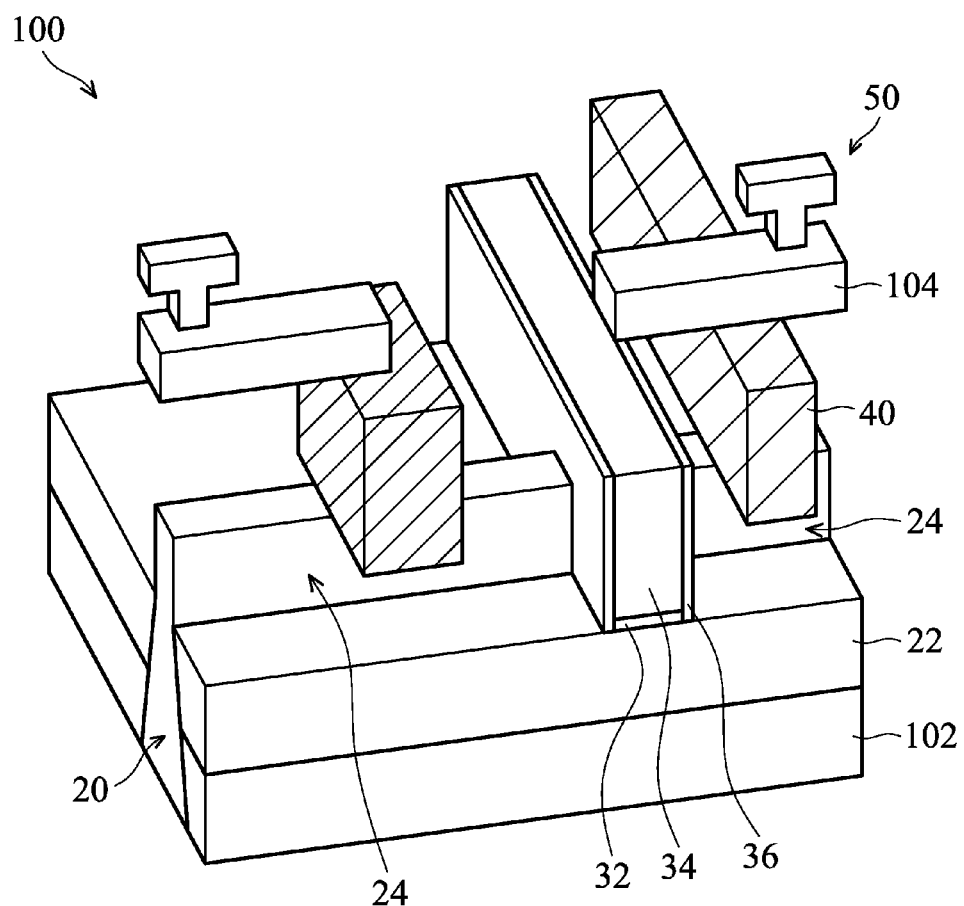
FIG. 1 shows a three-dimensional view of an interconnect structure on a fin field effect transistor (FinFET) device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a semiconductor structure with an interconnect structure are provided. The interconnect structure includes a number of metallization layers formed in a dielectric layer (such as inter-metal dielectric, IMD). One process for forming interconnect structure is the dual damascene process.

FIG. 1 shows a three-dimensional view of an interconnect structure on a fin field effect transistor (FinFET) device structure 100, in accordance with some embodiments of the disclosure.

The FinFET device structure 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The FinFET device structure 100 also includes one or more fin structures 20 (e.g., Si fins) that extend from the substrate 102. The fin structure 20 may optionally include germanium (Ge). The fin structure 20 may be formed by using suitable processes such as photolithography and etching processes. In some embodiments, the fin structure 20 is etched from the substrate 102 using dry etch or plasma processes.

An isolation structure 22, such as a shallow trench isolation (STI) structure, is formed to surround the fin structure 20. In some embodiments, a lower portion of the fin structure 20 is surrounded by the isolation structure 22, and an upper portion of the fin structure 20 protrudes from the isolation structure 22, as shown in FIG. 1. In other words, a portion of the fin structure 20 is embedded in the isolation structure 22. The isolation structure 22 prevents electrical interference or crosstalk.

The FinFET device structure 110 further includes a gate stack structure including a gate dielectric layer 32 and a gate electrode 34. The gate stack structure is formed over a central portion of the fin structure 20. In some other embodiments, the gate stack structure is a dummy gate stack and is replaced later by a metal gate (MG) after high thermal budget processes are performed.

As shown in FIG. 1, spacers 36 are formed on the opposite sidewalls of the gate electrode 34. The source/drain (S/D) structures 24 are formed adjacent to the gate stack structure. The contact structures 40 are formed over the source/drain (S/D) structures 24, and a first metal layer 104 is formed over the contact structure 40. A trench-via structure 50 is formed over the first metal layer 104. A second metal layer (not shown) will be formed on the trench-via structure 50. The trench-via structure 50 is disposed between the first metal layer 104 and the second metal layer and is configured to electrically connect to the first metal layer 104 and the second metal layer.

FIG. 1 is a simplified view of the interconnect structure including a first metal layer and trench-via structure 50 over the fin field effect transistor (FinFET) device structure 100. Some features, such as the inter-layer dielectric (ILD) layer and doped regions, are not shown in FIG. 1.

Figure 2:
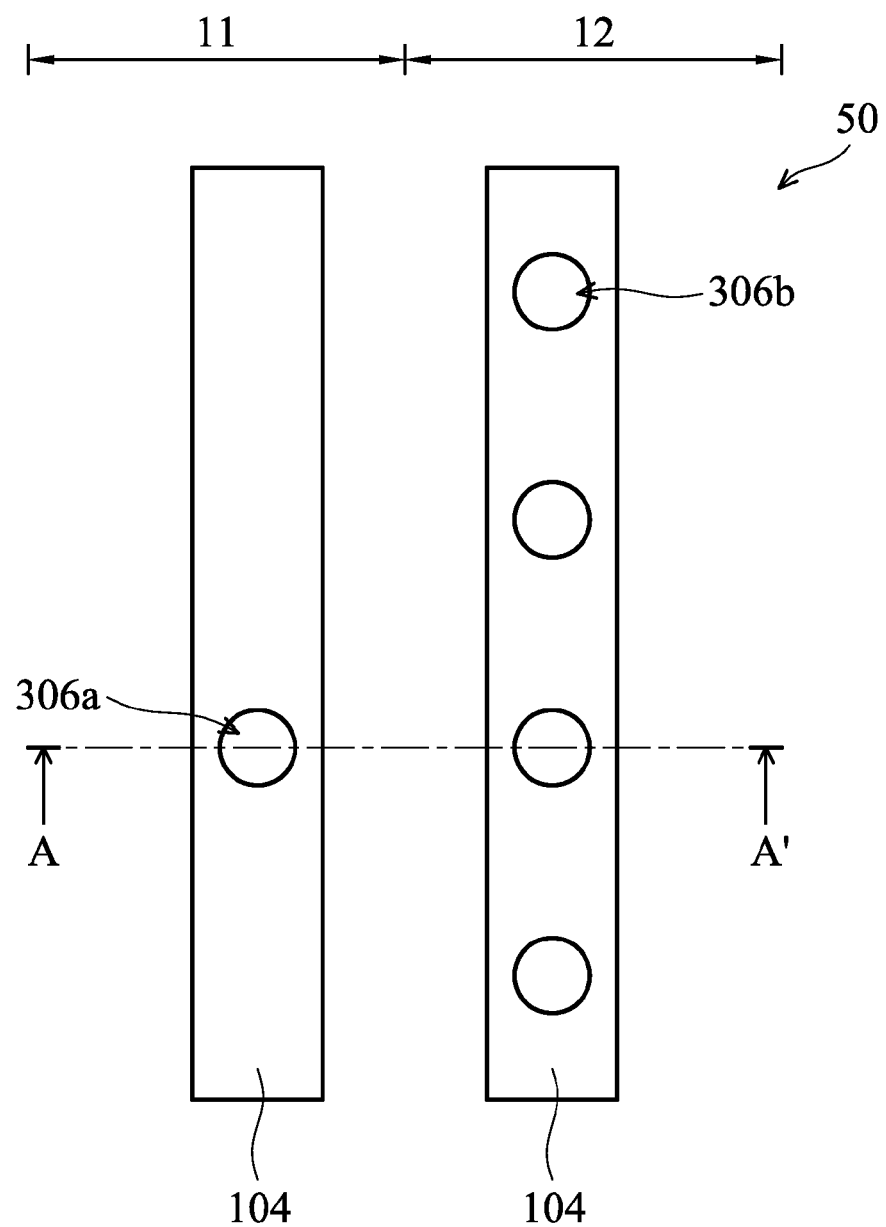
FIG. 2 shows a top view of the trench-via structure, in accordance with some embodiments of the disclosure.

FIG. 2 shows a top view of the trench-via structure 50, in accordance with some embodiments of the disclosure. The first metal layer 104 is formed over the substrate 102. The substrate 102 includes an isolated region 11 having isolated patterns and a dense region 12 having dense patterns. The first via portion 306a and the second via portions 306b are formed over the first metal layer 104. The number of first via portions 306a in the isolated region 11 is greater than the number of second via portions 306b in the dense region 12. One via hole 306a is formed in the isolated region 11, and four via holes 306a are formed in the dense region 12. The number of first via holes 306a and of second via portions 306b may be adjusted according to actual application.

FIGS. 3A-3M show cross-sectional representations of various stages of forming a FinFET device structure with an interconnect structure, in accordance with some embodiments of the disclosure. FIGS. 3A-3M show cross-sectional representations taken along the AA' line of FIG. 2.

Figure 3A:
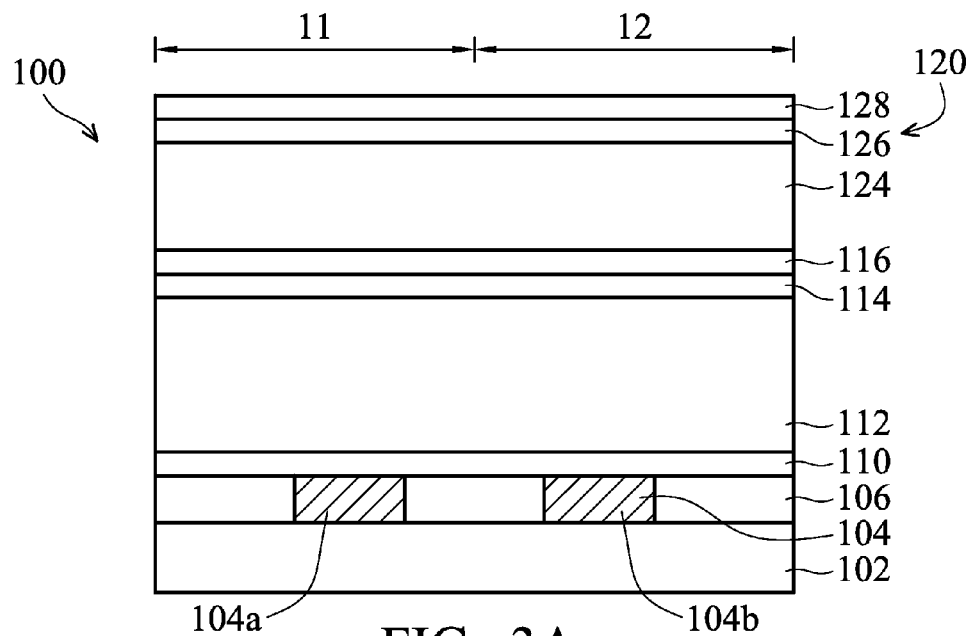
FIGS. 3A-3M show cross-sectional representations of various stages of forming a FinFET device structure with an interconnect structure, in accordance with some embodiments of the disclosure.
Figure 3B:
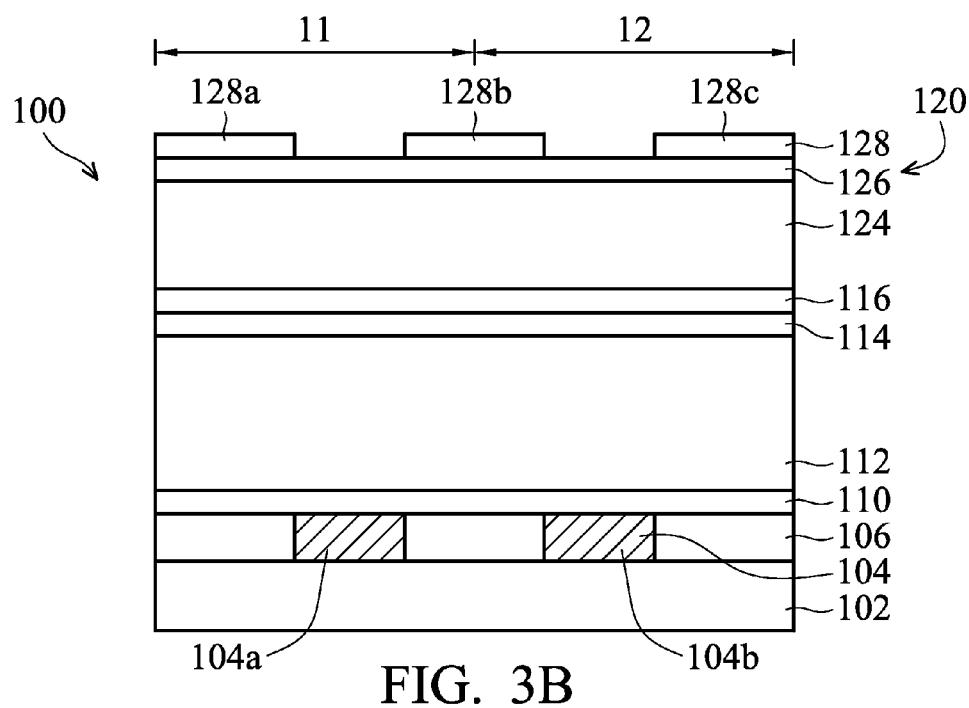

As shown in FIG. 3A, the substrate 102 may be made of silicon or other semiconductor materials. Some device elements (not shown) are formed in the substrate 102. Device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes. In some embodiments, device elements are formed in the substrate 102 in a front-end-of-line (FEOL) process.

As shown in FIG. 3A, a first dielectric layer 106 (such as inter-metal dielectric, IMD) is formed over the substrate 102, and the first metal layer 104 is embedded in the first dielectric layer 106. The first dielectric layer 106 and the first metal layer 104 are formed in a back-end-of-line (BEOL) process. The first metal layer 104 includes a first portion 104a in the isolated region 11 and a second portion 104b in the dense region 12.

The first dielectric layer 106 may be a single layer or multiple layers. The first dielectric layer 106 is made of silicon oxide (SiOx), silicon nitride (SixNy), silicon oxynitride (SiON), dielectric material(s) with low dielectric constant (low-k), or combinations thereof. In some embodiments, the first dielectric layer 106 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the dielectric layer 106 is deposited by a plasma enhanced chemical vapor deposition (PECVD) process or by a spin coating process.

In some embodiments, the first metal layer 104 is made of copper (Cu), copper alloy, aluminum (Al), aluminum alloy, tungsten (W), tungsten alloy, titanium (Ti), titanium alloy, tantalum (Ta) or tantalum alloy. In some embodiments, the first metal layer 104 is formed by a plating method.

An etch stop layer 110 is formed over the first dielectric layer 106. The etch stop layer 110 may be a single layer or multiple layers. The etch stop layer 110 is made of silicon oxide (SiOx), silicon carbide (SiC), silicon nitride (SixNy), silicon carbonitride (SiCN), silicon oxycarbide (SiOC), silicon oxycarbon nitride (SiOCN), or another applicable material. In some embodiments, the etch stop layer 110 has a bi-layer structure which includes a silicon oxide (SiOx) layer formed on a SiC layer, and silicon oxide layer is formed from tetraethyl orthosilicate (TEOS). The SiC layer is used as a glue layer to improve adhesion between the underlying layer and the silicon oxide layer.

A second dielectric layer 112 is formed over the etch stop layer 110. The second dielectric layer 112 may be a single layer or multiple layers. The second dielectric layer 112 is made of silicon oxide (SiOx), silicon nitride (SixNy), silicon oxynitride (SiON), dielectric material(s) with low dielectric constant (low-k), or combinations thereof. In some embodiments, the second dielectric layer 112 is made of an extreme low-k (ELK) dielectric material with a dielectric constant (k) less than about 2.5.

An antireflection layer 114 and a hard mask layer 116 are sequentially formed over the second dielectric layer 112. In some embodiments, the antireflection layer 114 is made of nitrogen-free material, such as silicon oxycarbide (SiOC). In some embodiments, the hard mask layer 116 is made of a metal material, such as titanium nitride (TiN), tantalum nitride (TaN), or tungsten nitride (WN). The hard mask layer 116 made of metal material is configured to provide a high etch selectivity relative to the second dielectric layer 112 during the plasma process.

A tri-layer photoresist structure 120 is formed on the hard mask layer 116. The tri-layer photoresist structure 120 includes a bottom layer 124, a middle layer 126 and a top layer 128. In some embodiments, the bottom layer 124 is a bottom anti-reflective coating (BARC) layer which is used to reduce reflection during the photolithography process. In some embodiments, the bottom layer 124 is made of nitrogen-free material, such as silicon rich oxide, or silicon oxycarbide (SiOC). In some embodiments, the middle layer 126 is made of silicon-based material, such as silicon nitride, silicon oxynitride or silicon oxide.

The top layer 128 may be a positive photoresist layer or a negative photoresist layer. In some embodiments, the top layer 128 is made of Poly (methyl methacrylate) (PMMA), Poly (methyl glutarimide) (PMGI), Phenol formaldehyde resin (DNQ/Novolac) or SU-8. In some embodiments, the ratio of the thickness of the bottom layer 124 to the thickness of the middle layer 126 is in a range from about 4 to about 8.

Afterwards, the top layer 128 is patterned to form a patterned top layer 128 as shown in FIG. 2B, in accordance with some embodiments of the disclosure. The patterned top layer 128 includes a first portion 128a, a second portion 128b and a third portion 128c.

Figure 3C:
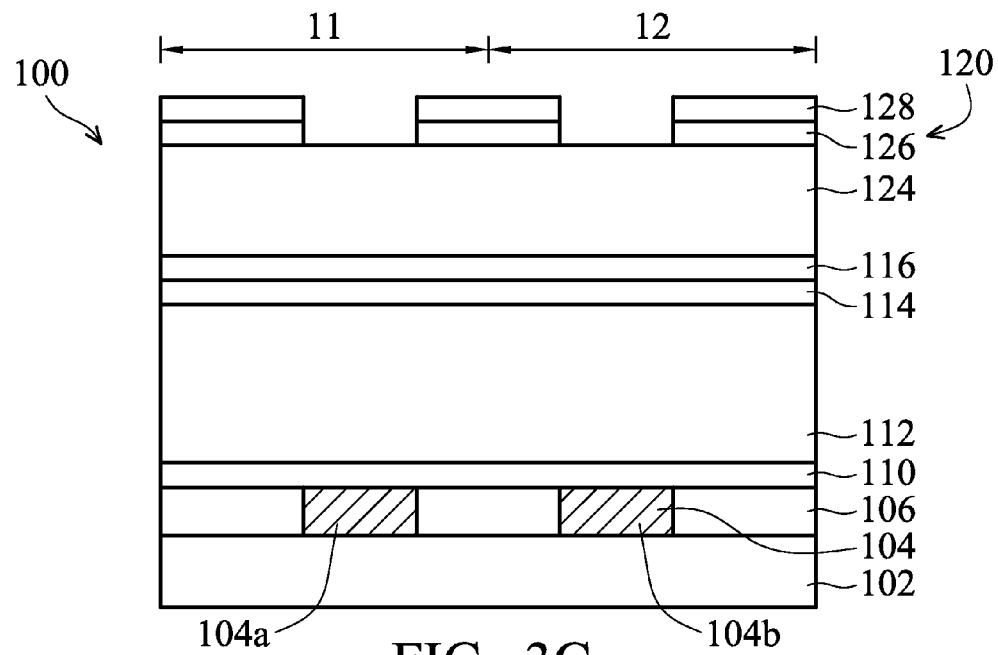

After the top layer 128 is patterned, the middle layer 126 is patterned by using the patterned top layer 128 as a mask as shown in FIG. 3C, in accordance with some embodiments of the disclosure. As a result, the pattern of the top layer 128 is transferred to the middle layer 126 to form the patterned middle layer 126.

Figure 3D:
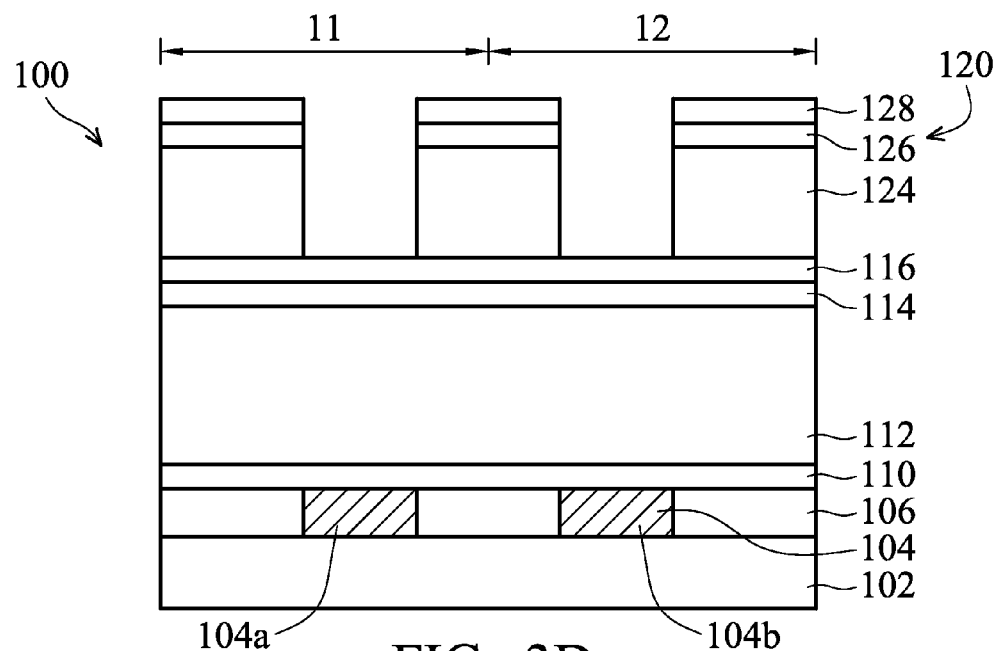

After the middle layer 126 is patterned, the bottom layer 124 is patterned by using the patterned middle layer 126 as a mask as shown in FIG. 3D, in accordance with some embodiments of the disclosure.

Figure 3E:
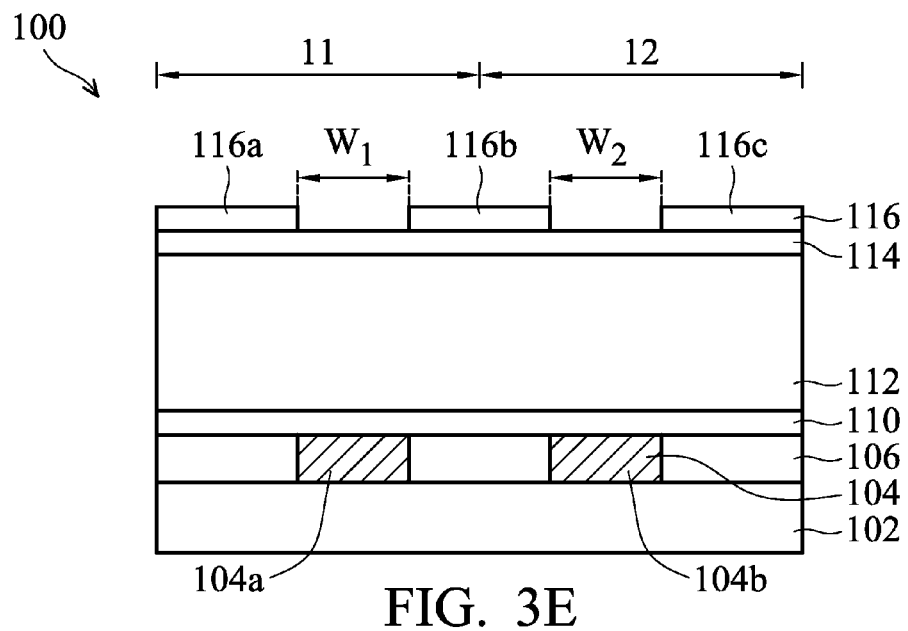

Afterwards, the hard mask layer 116 is patterned by using the patterned bottom layer 124 as a mask as shown in FIG. 3E, in accordance with some embodiments of the disclosure. Afterwards, the tri-layer photoresist structure 120 is removed by an etching process. Therefore, the patterned hard mask layer 116 is obtained, and it includes a first portion 116a, a second portion 116b and a third portion 116c. The first width $W_1$ between the first portion 116a and the second portion 116b is equal to the second width $W_2$ between the second portion 116b and the third portion 116c.

Figure 3F:
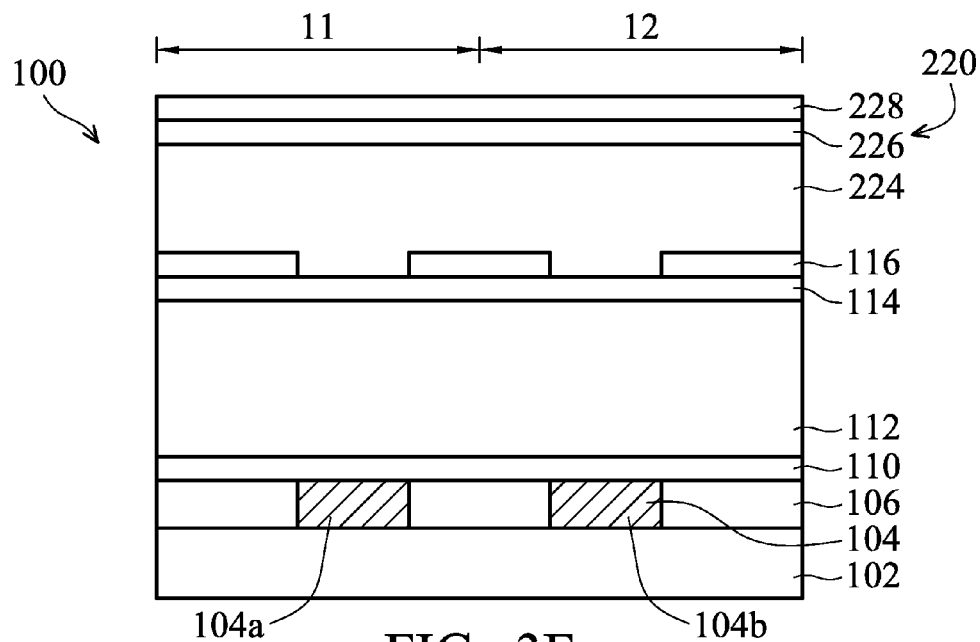

After the hard mask layer 116 is patterned, a second photoresist structure 220 is formed over the patterned hard mask layer 116 as shown in FIG. 3F, in accordance with some embodiments of the disclosure. The second photoresist structure 220 includes a bottom layer 224, a middle layer 226 and a top layer 228.

Figure 3G:
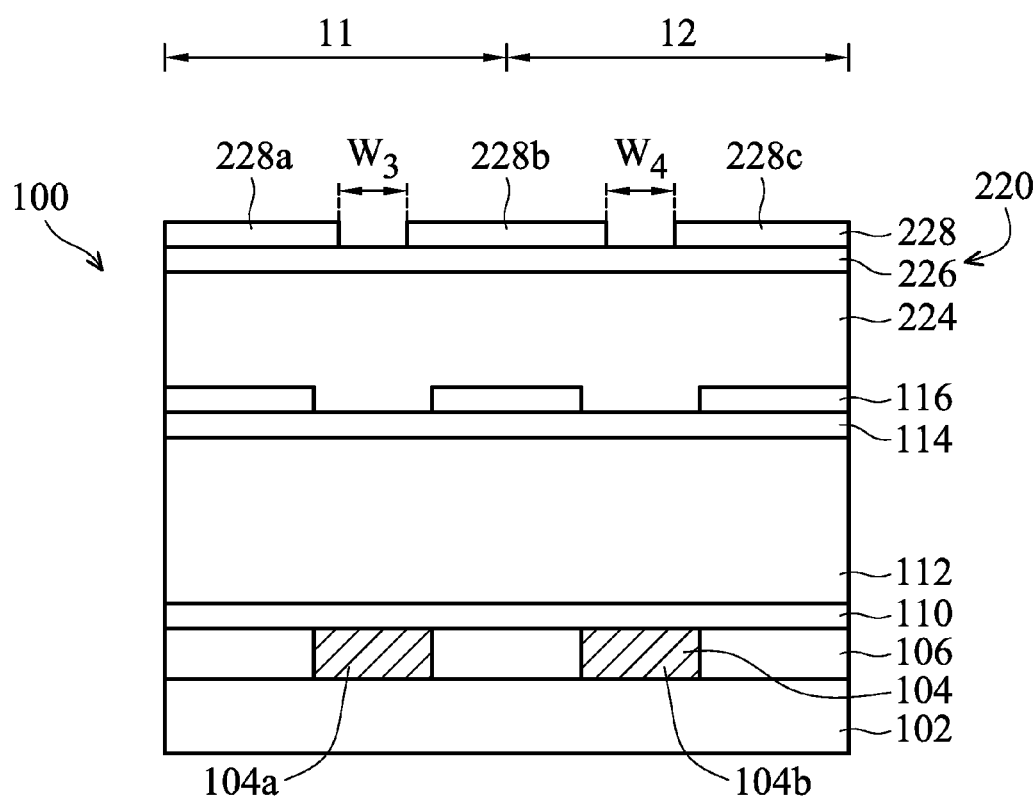

The top layer 128 is firstly patterned to form a patterned top layer 228 as shown in FIG. 3G, in accordance with some embodiments of the disclosure. The patterned top layer 228 includes a first portion 228a, a second portion 228b and a third portion 228c. A third width $W_3$ between the first portion 228a and the second portion 228b is equal to a fourth width $W_4$ between the second portion 228b and the third portion 228c. The third width $W_3$ between the first portion 228a and the second portion 228b is smaller than the first width $W_1$ between the first portion 116a and the second portion 116b of the patterned hard mask layer 116 (as shown in FIG. 3E).

Figure 3H:
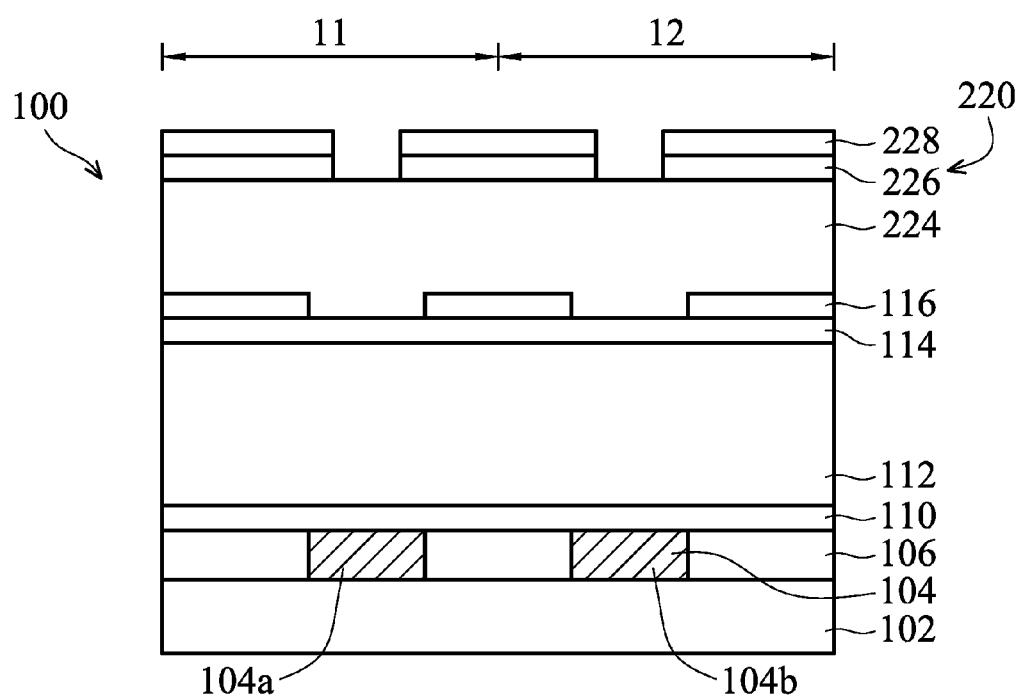

Afterwards, the middle layer 226 is patterned by using the patterned top layer 228 as a mask as shown in FIG. 3H, in accordance with some embodiments of the disclosure.

Figure 3I:
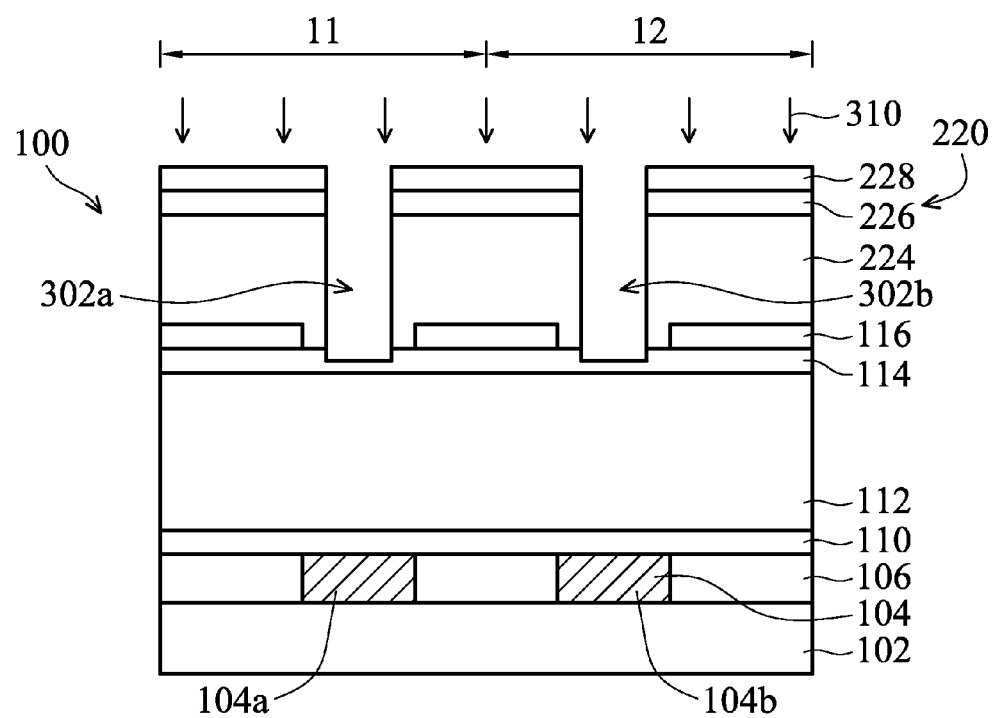

After the middle layer 226 is pattered, the bottom layer 224 and a portion of antireflection layer 114 is removed as shown in FIG. 3I, in accordance with some embodiments of the disclosure. The portion of antireflection layer 114 is removed by a first etching process 310. Therefore, a first recess 302a in the isolated region 11 and a second recess 302b in the dense region 12 are obtained. The sidewalls of the first recess 302a are vertical and the sidewalls of the second recess 302b are vertical. In other words, the first recess 302a and the second recess 302b have a substantially vertical profile. The width of the first recess 302a is substantially equal to the width of the second recess 302b.

The first plasma process 310 includes using a first etch gas including oxygen gas ($O_2$), carbon dioxide ($CO_2$) or another applicable gas. In addition to gas, the first etching process 310 may be fine-tuned with various parameters, such as pressure, power, temperature and/or other suitable parameters.

In some embodiments, the pressure of the first etching process 310 is in a range from about 1 mtorr to about 50 mtorr. If the pressure of the first etching process 310 is lower than 1 mtorr, the etching rate is too low. If the pressure of the first etching process 310 is greater than 50 mtorr, the etching uniformity is poor. In some embodiments, the power of the first etching process 310 is in a range from about 100 W to about 1500 W. If the power is lower than 100 W, the etching rate is too low. If the power is greater than 1500 W, the etching rate is too fast, and the critical dimension (CD) is difficult to control. In some embodiments, the temperature of the first etching process 310 is in a range from about 10 degrees to about 80 degrees. If the temperature is lower than 10 degrees, the etching time is too long, and the fabrication cost is high. If the temperature is greater than 80 degrees, the etching rate is too fast, and the critical dimension (CD) is difficult to control.

Figure 3J:
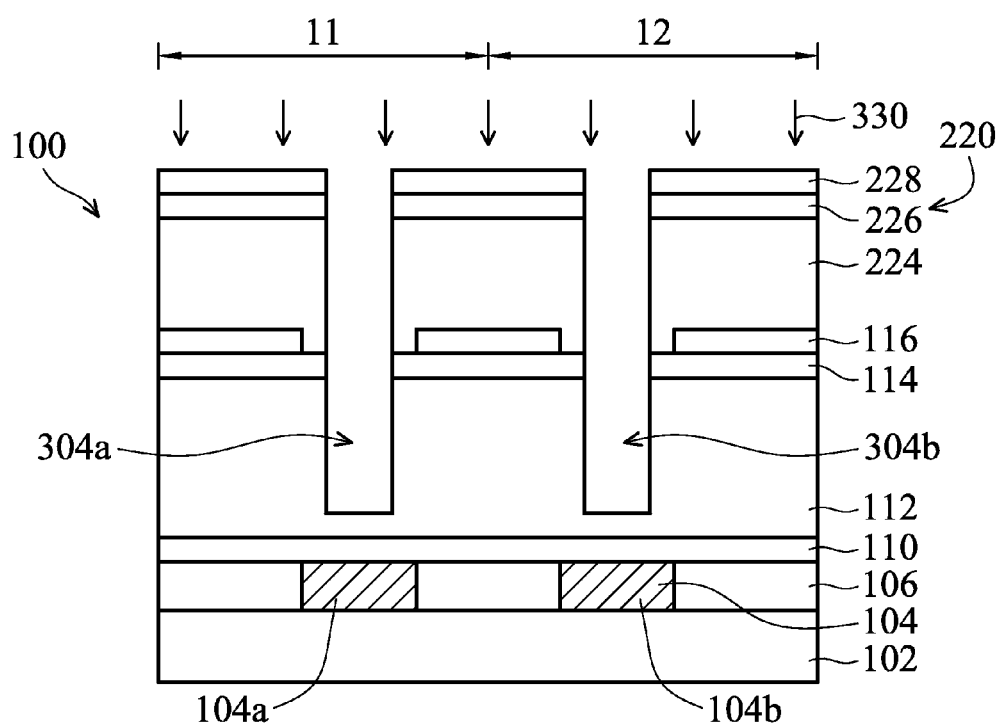

After forming the first recess 302a and the second recess 302b, the antireflection layer 114 is etched through and a portion of the second dielectric layer 112 is removed by a second etching process 330 as shown in FIG. 3J, in accordance with some embodiments of the disclosure.

As a result, the first recess 302a is elongated to form a first opening 304a, and the second recess 302b is elongated to form a second opening 304b. It should be noted that the sidewall of the first opening 304a is vertical and the sidewall of the second opening 304b is vertical. In other words, the first opening 304a and the second opening 304b respectively have a substantially vertical profile. The width of the first opening 304a is substantially equal to the width of the second opening 304b.

For regions with different exposed areas (or etched areas), it is difficult to control etch uniformity due to the loading effect. Depending on the etching strategy, the loading effect is the etch rate for a larger exposed area being either faster or slower than it is for a smaller exposed area. In other words, the loading effect is that the etch rate in large area is mismatched the etch rate in small area. This means that the loading effect may be affected by the pattern density. Therefore, while etching the second dielectric layer 224 with a different pattern density in the isolated region 11 and the dense region 12, it is more difficult to control the uniformity of the etch depth.

In order to reduce the loading effect, the parameters of the second etching process 330 is adjusted. The second etching process 330 is performed by using a second etch gas comprising fluorine-containing gas, nitrogen ($N_2$), oxygen ($O_2$) or combinations thereof. The fluorine-containing gas includes nitrogen hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), or combinations thereof.

When the second etching process 330 is performed, an etching operation and the deposition operation occur concurrently. In some embodiments, when the second dielectric layer 112 is made of silicon oxide, the tetrafluoromethane ($CF_4$) is used as a main etch gas, and the chemical reaction (I) occurs. When the ratio of the carbon to fluorine (C/F) is 1/4, the silicon oxide is completely removed. Alternatively, if the ratio of the carbon to fluorine (C/F) is not 1/4, the etch rate for the second dielectric layer 112 is changed. Therefore, by changing the ratio of the carbon to fluorine (C/F), the etch rate is adjusted.

$$CF_4 + SiO_2 \rightarrow SiF_4(g) + CO_2(g) \qquad (I)$$

In some embodiments, when tetrafluoromethane ($CF_4$) is used as a main etch gas in the first etching process 310, the other fluorine-containing gas, such as octofluorocyclobutane ($C_4F_8$) is used to adjust the ratio of the carbon to fluorine (C/F). In some embodiments, the ratio (C/F) of the carbon to fluorine in the second etching process 330 is controlled to within a range from about 1/4 to about 1/2. If the ratio of the carbon to fluorine (C/F) is less than 1/4, the etching uniformity is difficult to control. If the ratio of carbon to fluorine (C/F) is greater than 1/2, the undesirable by-products may increase and therefore the critical dimension (CD) may be smaller than the predetermined CD.

In some embodiments, the ratio (C/F/O) of the carbon to fluorine to oxygen in the second etching process 330 is controlled to within a range from about 22:44:1 to about 22:88:1. If the amount of oxygen is increased, the etching rate is fast, but the etching profile is difficult to control. If the amount of oxygen is decreased, the etching rate is small. However, the undesirable by-products may increase, and therefore the critical dimension may be smaller than the predetermined CD.

In some embodiments, the pressure of the second etching process 330 is in a range from about 1 mtorr to about 80 mtorr. If the pressure of the second etching process 330 is lower than 1 mtorr, the etching rate is too low. If the pressure of the second etching process 330 is greater than 80 mtorr, the etching uniformity is poor. In some embodiments, the power of the second etching process 330 is in a range from about 100 W to about 1500 W. If the power is lower than 100 W, the etching rate is too low. If the power is greater than 1500 W, the etching rate is too fast, and the critical dimension (CD) is difficult to control. In some embodiments, the temperature of the second etching process 330 is in a range from about 10 degrees to about 80 degrees. If the temperature is lower than 10 degrees, the etching time is too long, and the fabrication cost is high. If the temperature is greater than 80 degrees, the etching rate is too fast, and the critical dimension (CD) is difficult to control.

Figure 3K:
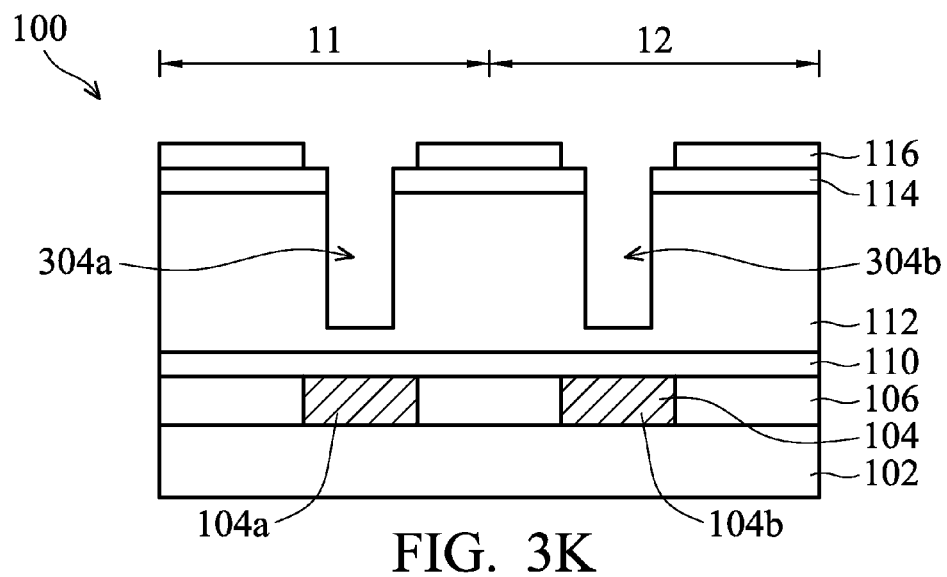

Afterwards, the second photoresist structure 220 is removed as shown in FIG. 3K, in accordance with some embodiments of the disclosure. Therefore, the patterned hard mask layer 116 is exposed.

Figure 3L:
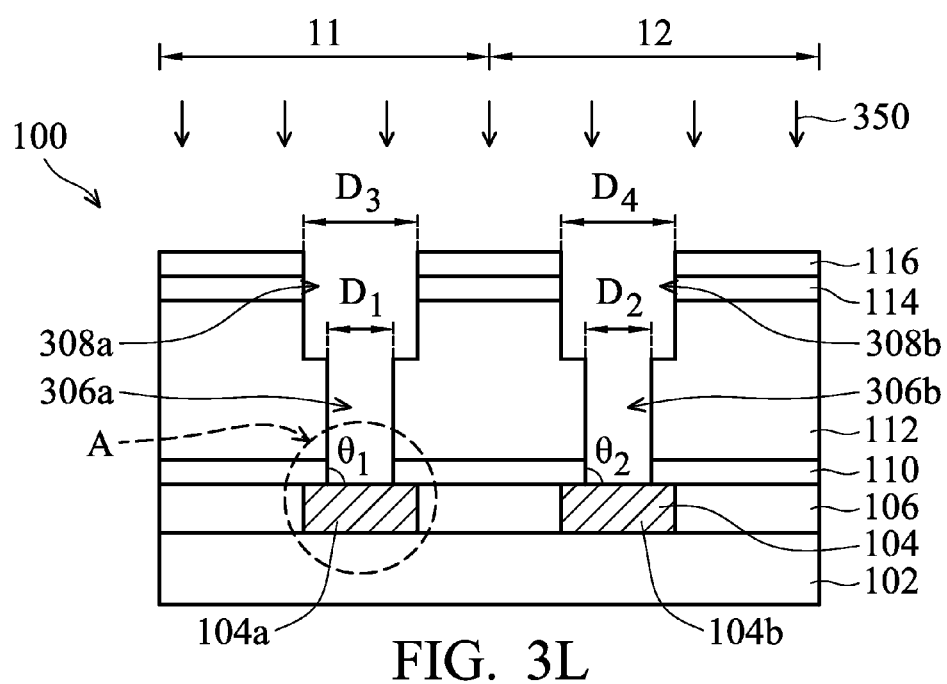

After the second photoresist structure 220 is removed, the second dielectric layer 112 and the etch stop layer 110 are etched through to expose the first metal layer 104 by a third etching process 350 as shown in FIG. 3L, in accordance with some embodiments of the disclosure.

Therefore, a first via portion 306a and a first trench portion 308a are formed in the isolated region 11. The first via portion 306a and the first trench portion 308a collectively constitute a first trench-via structure for use as a dual damascene cavity. A second via portion 306b and a second trench portion 306b are formed in the dense region 12. The second via portion 306b and the second trench portion 306b collectively constitute a second trench-via structure for use as a dual damascene cavity.

The first via portion 306a has a first width $D_1$, and the second via portion 306b has a second width $D_2$. In some embodiments, the first width $D_1$ is equal to the second width $D_2$. In some embodiments, the first width $D_1$ is in a range from about 30 nm to about 60 nm. In some embodiments, the second width $D_2$ is in a range from about 30 nm to about 60 nm. If the first width $D_1$ and the second width $D_2$ are smaller than 30 nm, the dimensions are too small to fill the conductive material. If the first width $D_1$ and the second width $D_2$ are greater than 30 nm, the pitch between two adjacent via portions may be smaller than the predetermined value. The first trench portion 308a has a third width $D_3$, and the second trench portion 308a has a fourth width $D_4$. In some embodiments, the third width $D_3$ is equal to the fourth width $D_4$.

As shown in FIG. 3L, the first via portion 306a is vertical to the top surface of the first portion 104a of the first metal layer 104, and the second via portion 306b is vertical to the top surface of the second portion 104b of the first metal layer 104. In some embodiments, an first angle $\theta_1$ between the sidewall of the first via portion 306a and the top surface of the first portion 104a of the first metal layer 104 is in a range from about 85 degrees to about 95 degrees. In some embodiments, a second angle $\theta_2$ between the sidewall of the second via portion 306b and the top surface of the second portion 104b of the first metal layer 104 is in a range from about 85 degrees to about 95 degrees.

It should be noted that when the third etching process 350 is performed, the etch stop layer 110 is more difficult to remove than the second dielectric layer 112, and the loading effect also occurs between the isolated region 11 and the dense region 12. In order to reduce the loading effect, the parameter of the third etching process 350 is controlled.

The third etching process 350 is performed by using a third etch gas comprising fluorine-containing gas, nitrogen ($N_2$), oxygen ($O_2$) or combinations thereof, The fluorine-containing gas includes nitrogen hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), or combinations thereof.

In some embodiments, the ratio (C/F) of the carbon to fluorine in the third etching process 350 is controlled to within a range from about 1/4 to about 1/2. If the ratio of the carbon to fluorine (C/F) is less than 1/4, the etching uniformity is difficult to control. If the ratio of the carbon to fluorine (C/F) is greater than 1/2, the undesirable by-products may increase and therefore the critical dimension (CD) may be smaller than the predetermined CD.

The third etch gas used in the third etching process 350 further includes a diluting gas, such as an inert gas, for example argon (Ar) or helium (He). The diluting gas is used to decrease the loading effect. In some embodiments, the ratio of the flow rate of diluting gas to the flow rate of the third etch gas is in a range from about 20/1 to about 40/1. In some embodiments, the flow rate of diluting gas is in a range from about 800 sccm to about 1000 sccm. If the ratio or the flow rate of diluting gas is too small, the loading effect may be serious. If the ratio or the flow rate of diluting gas is too high, the etching rate may be too slow, and the fabrication cost may increase.

In some embodiments, the pressure of the third etching process 350 is in a range from about 1 mtorr to about 45 mtorr. If the pressure of the third etching process 350 is less than 1 mtorr, the etching rate is too low. If the pressure of the third etching process 350 is greater than 45 mtorr, the etching uniformity is poor. In some embodiments, the power of the third etching process 350 is in a range from about 100 W to about 1500 W. If the power is less than 100 W, the etching rate is too low. If the power is greater than 1500 W, the etching rate is too fast, and the critical dimension (CD) is difficult to control very well. In some embodiments, the temperature of the third etching process 350 is in a range from about 10 degrees to about 80 degrees. If the temperature is lower than 10 degrees, the etching time is too long, and the fabrication cost is high. If the temperature is greater than 80 degrees, the etching rate is too fast, and the critical dimension (CD) is difficult to control.

FIG. 3L' shows an enlarged view of a region A of FIG. 3L, in accordance with some embodiments of the disclosure. The first via portion 306a has a pair of sidewalls 306as1 and a bottom surface 106B. The sidewalls 306as1 are substantially vertical to the top surface of the first portion 104a of the first metal layer 104. The pair of first sidewalls 306as1 is symmetric in relation to the middle point of the bottom surface of the first via portion 306a. The upper portion of the first sidewall 306as1 is adjoined to the second dielectric layer 12, and the lower portion of the first sidewall 306as1 is adjoined to the etch stop layer 110.

FIG. 3L" shows another embodiment of the enlarged view of a region A of FIG. 3L. As shown in FIG. 3L", the left sidewall 306as1 of the first via portion 306a has one angle point P. The upper portion of the left sidewall 306as1 above the point P is vertical, and the lower portion of the left sidewall 306as1 below the point P is sloped to the top surface of the first portion 104a of the first metal layer 104. In other words, the slope of the upper portion of the left sidewall 306as1 is different from the slope of the lower portion of the left sidewall 306as1.

In some embodiments, a third angle $\theta_3$ between the lower portion of the left sidewall 306as1 and the top surface of the first portion 104a of the first metal layer 104 is in a range from about 85 degrees to about 95 degrees. The first width D1 as shown in FIG. 3L" is the width of the bottom surface 306B.

Afterwards, the antireflection layer 114 and hard mask layer 116 are removed. In some embodiments, the antireflection layer 114 and hard mask layer 116 are removed by a chemical mechanical polishing (CMP) process.

Figure 3M:
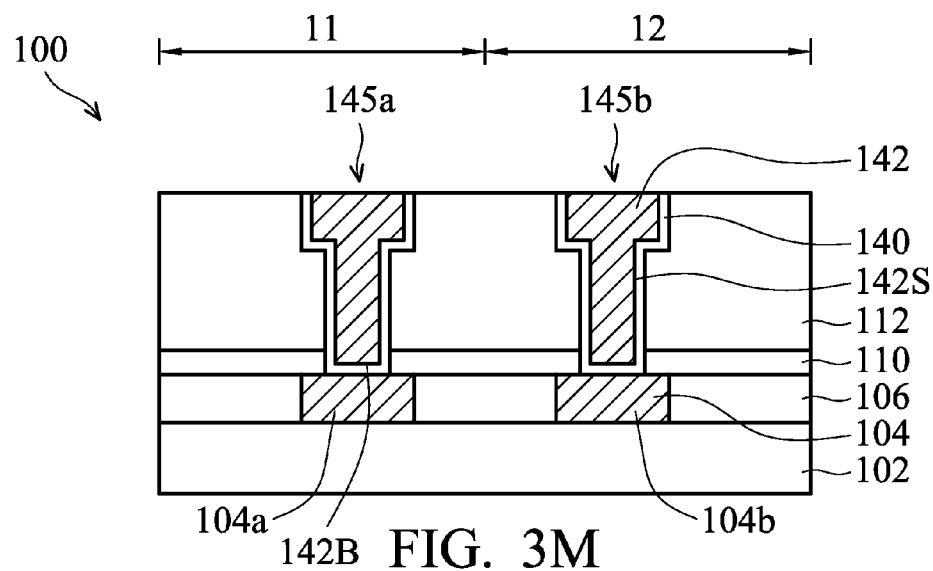

Afterwards, a diffusion barrier layer 140 is formed in first trench-via structure and second trench-via structure, and a conductive feature 142 is formed on the diffusion barrier layer 140 as shown in FIG. 3M, in accordance with some embodiments of the disclosure. In other words, the conductive feature 142 is formed in the second dielectric layer 112, and it is surrounded by the diffusion barrier layer 140. A first conductive structure 145a is formed by filling the diffusion barrier layer 140 and the conductive feature 142 in the first trench-via structure, and a second conductive structure 145b is formed by filling the diffusion barrier layer 140 and the conductive feature 142 in the second trench-via structure. The conductive feature 142 is electrically connected to the first metal layer 104. The first metal layer 104 embedded in the first dielectric layer 106 and the conductive feature 142 embedded in second dielectric layer 112 construct a portion of the interconnect structure.

In some embodiments, the diffusion barrier layer 140 may be made of titanium (Ti), titanium nitride (TiN), tantalum (Ta), tantalum nitride (TaN), or aluminum nitride (AlN). In some embodiments, the conductive feature 142 is made of copper, and the diffusion barrier layer 202 includes a TaN/Ta bi-layer.

It should be noted that the conductive feature 142 has a pair of first sidewalls $142S_1$ connected to a bottom surface 142B. The first sidewalls $142S_1$ are vertical to the bottom surface 142B.

It should be noted that since more surface area of the second photoresist structure 220 in the isolated region 11 is exposed than that in the dense region 12 when the pattern of the via portion is firstly defined as shown in FIG. 3I, the etchant will react with more materials in the isolated region 11 than in the dense region 12. Therefore, the loading effect occurs between the isolated region 11 and the dense region 12. If more by-products are left in the isolated region 11, the width of the first via portion 306a may be smaller than the predetermined width. The bottom profile of the first via portion 306a may be shrunk. Consequently, the resistance of the first trench-via structure may be increased because the contact area between the first metal layer 104 and the first trench-via structure is reduced. The increased resistance may lead to device failure.

In order to reduce the loading effect between the isolated region 11 and the dense region 12, the first etching process 310, the second etching process 330 and the third etching process 350 are used to define the pattern of the first via portion 306a and the second via portion 306b. In some embodiments, the first etching process 310, the second etching process 330 and the third etching process 350 are performed in the same chamber, and fabrication time is reduced. In other words, the first etching process 310, the second etching process 330 and the third etching process 350 are performed in-situ without transferring to different chamber.

The first etching process 310 is used to etch the bottom layer 224. In the first etching process 310, the first recess 302a is formed in the isolated region 11 and the second recess 302b is formed in the dense region 12. The first recess 302a and the second recess 302b are both vertical to the top surface of the antireflection layer 114. In some embodiments, the width of the first recess 302a can be made equal to that of the second recess 302b by controlling the first etch gas, the pressure, power and temperature of the first etching process 310.

The second etching process 330 is used to etch the second dielectric layer 112. In the second etching process 330, the first opening 304a is formed in the isolated region 11 and the second opening 304b is formed in the dense region 12. In some embodiments, the width of the first opening 304a is equal to that of the second opening 304b by controlling the ratio (C/F) of carbon to fluorine or the ratio (C/F/O) of carbon to fluorine to oxygen in the second etching process 330.

The third etching process 350 is used to define the pattern of the via portions 306a, 306b and the trench portions 308a, 308b. In the third etching process 350, the first via portion 306a and the first trench portion 308a are formed in the isolated region 11. The second via portion 306b and the second trench portion 306b are formed in the dense region 12. The bottom width of the first via portion 306a is substantially equal to the bottom width of the second via portion 306b.

The bottom profile of the first via portion 306a is improved by using the first etching process 310, the second etching process 330 and the third etching process 350. When the bottom profile of the first via portions 306a is improved, the process window for filling conductive material is also increased. Therefore, the performance of the FinFET device structure is improved.

Figure 4A:
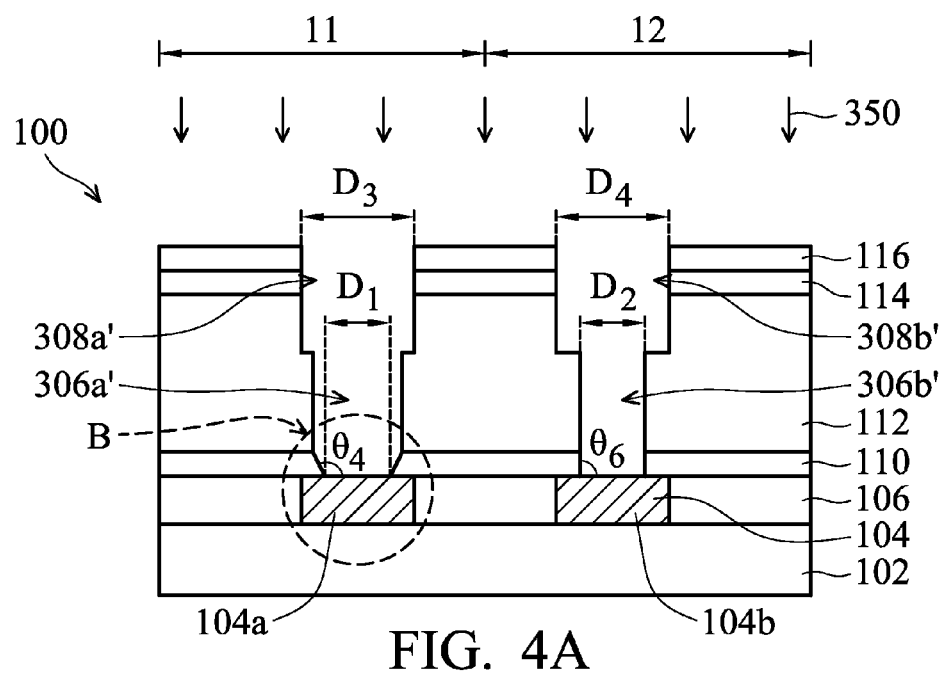
FIGS. 4A-4B show cross-sectional representations of various stages of forming a FinFET device structure with an interconnect structure, in accordance with some embodiments of the disclosure.
Figure 4A:
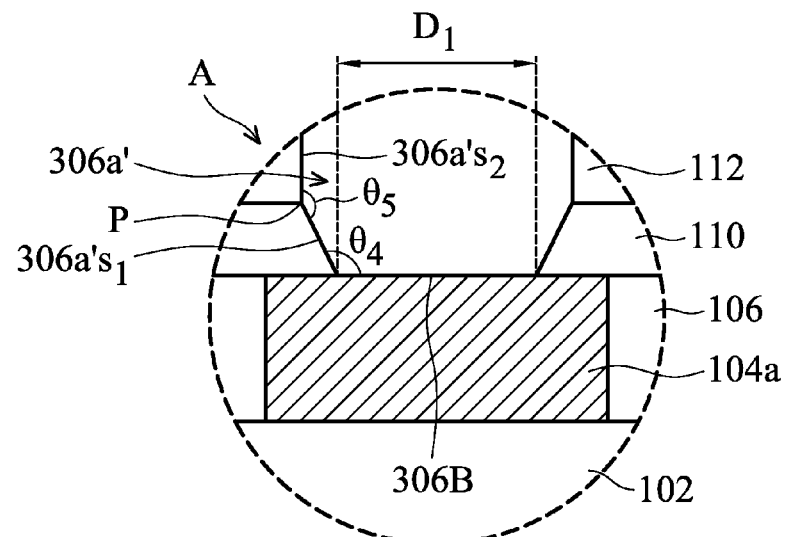
Figure 4B:
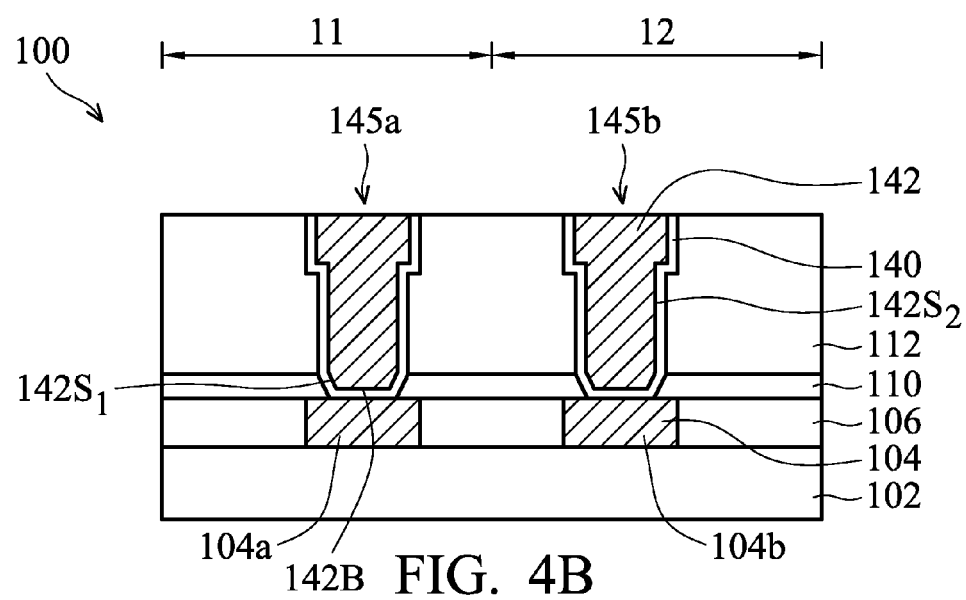

FIGS. 4A-4B show cross-sectional representations of various stages of forming a FinFET device structure with an interconnect structure, in accordance with some embodiments of the disclosure.

Referring to FIG. 4A, the first etching process 310, the second etching process 330 and the third etching process 350 are sequentially performed to form a first via portion 306a' and a second via portion 306' in the second dielectric layer 112. A first trench portion 308a' is over the first via portion 306a' and a second trench portion 308b' is over the second via portion 3068'. The parameters of the third etching process 350 are described above, and therefore are omitted here for brevity.

As mentioned above, the etch stop layer 110 is more difficult to remove than the second dielectric layer 112 when the third etching process 350 is performed. Therefore, is some embodiments, a portion of the etch stop layer 110 may be left on the first metal layer 104.

FIG. 4A' shows an enlarged view of a region B of FIG. 4A, in accordance with some embodiments of the disclosure.

As shown in FIG. 4A', the first via portion 306a' has a bottom surface 306B, a pair of first sidewalls 306a's1 connecting the bottom surface 306B, and a pair of second sidewalls 306a's2 connected to the first sidewalls 306a's1. An angle point P is between the first sidewalls 306a's1 and the second sidewalls 306a's2. The angle point P is also located at an interface between the etch stop layer 110 and the second dielectric layer 112. The first sidewalls 306a's1 taper gradually toward the bottom surface 306B. In other words, the slope of the first sidewalls 306a's1 is different from that of the second sidewalls 306a's2.

The bottom surface 306B of the first via portion 306a' has a first width $D_1$. The bottom surface of the second via portion 306b' has a second width $D_2$. The first width $D_1$ is equal to the second width $D_2$. In some embodiments, the first width $D_1$ is in a range from about 30 nm to about 60 nm. In some embodiments, the second width $D_2$ is in a range from about 30 nm to about 60 nm.

In some embodiments, a fourth angle $\theta_4$ between the bottom surface 306B and the first sidewall 306a's1 is in a range from about 80 degrees to about 90 degrees. In some embodiments, a fifth angle $\theta_5$ between the first sidewall 306a's1 and the second sidewall 306a's2 is in a range from about 170 degrees to about 180 degrees. The bottom profile of the first via portion 306a' is improved, when the fourth angle $\theta_4$ and the fifth angle $\theta_5$ are controlled to within the above-mentioned range.

Afterwards, the diffusion barrier layer 140 is formed in the first trench-via structure and second trench-via structure, and the conductive feature 142 is formed over diffusion barrier layer 140 as shown in FIG. 4B, in accordance with some embodiments of the disclosure.

It should be noted that the conductive feature 142 has a pair of first sidewalls $142S_1$ connected to the bottom surface 142B and a pair of second sidewalls $142S_2$ connected to the first sidewall $142S_1$. The second sidewalls $142S_2$ are vertical and the first sidewalls $142S_2$ taper gradually toward the bottom surface 142B.

FIGS. 5A-5D show cross-sectional representations of various stages of forming a FinFET device structure with an interconnect structure, in accordance with some embodiments of the disclosure. The parameters of the first etching process 310, the second etching process 330, and the third etching process 350 are described above, and therefore are omitted for brevity.

Figure 5A:
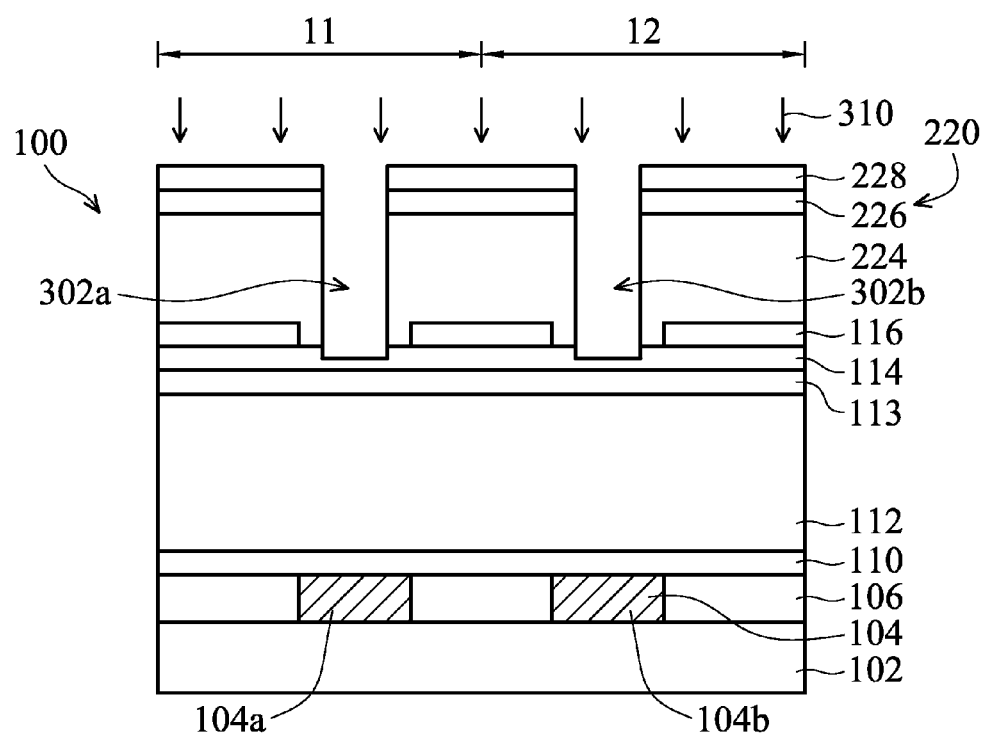
FIGS. 5A-5D show cross-sectional representations of various stages of forming a FinFET device structure with an interconnect structure, in accordance with some embodiments of the disclosure.

FIG. 5A is similar to FIG. 3I, the difference being that a buffer layer 113 is formed between the second dielectric layer 112 and the antireflection layer 116. The first etching process 310 is performed to etch through the bottom layer 224.

Figure 5B:
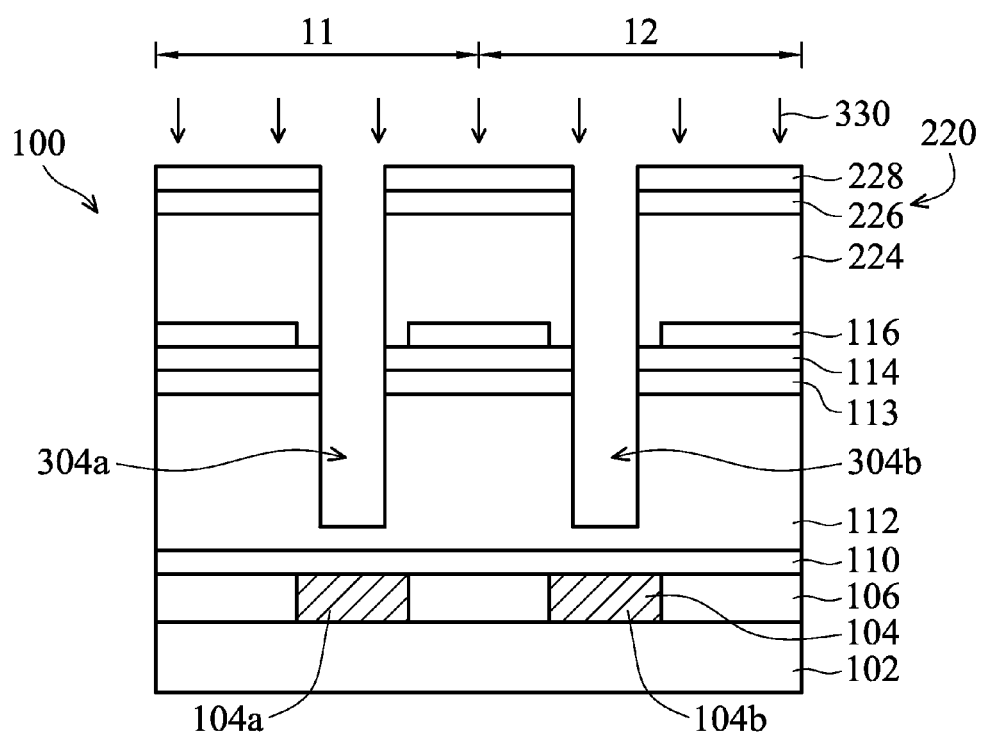

Afterwards, the antireflection layer 114 and the buffer layer 113 are etched through, and a portion of the second dielectric layer 112 is etched as shown in FIG. 5B, in accordance with some embodiments of the disclosure. The second etching process 330 is performed to etch a portion of the second dielectric layer 112.

It should be noted that the etch rate of the buffer layer 113 is between an etch rate of the antireflection layer 114 and an etch rate of the dielectric layer 112. Therefore, while performing the second etching process 330, the etching profile of the second dielectric layer 112 may be well controlled.

Figure 5C:
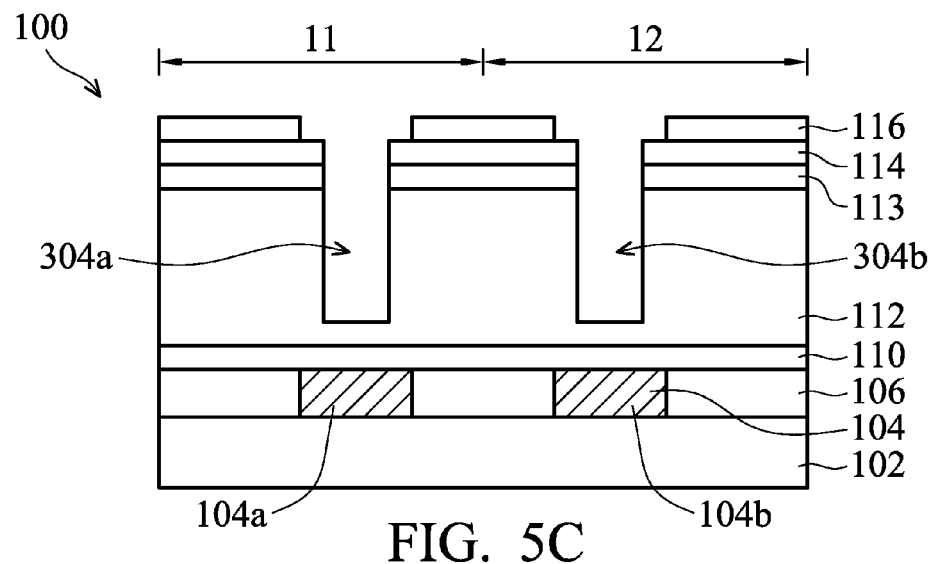

Afterwards, the second tri-layer photoresist structure 220 is removed as shown in FIG. 5C, in accordance with some embodiments of the disclosure.

Figure 5D:
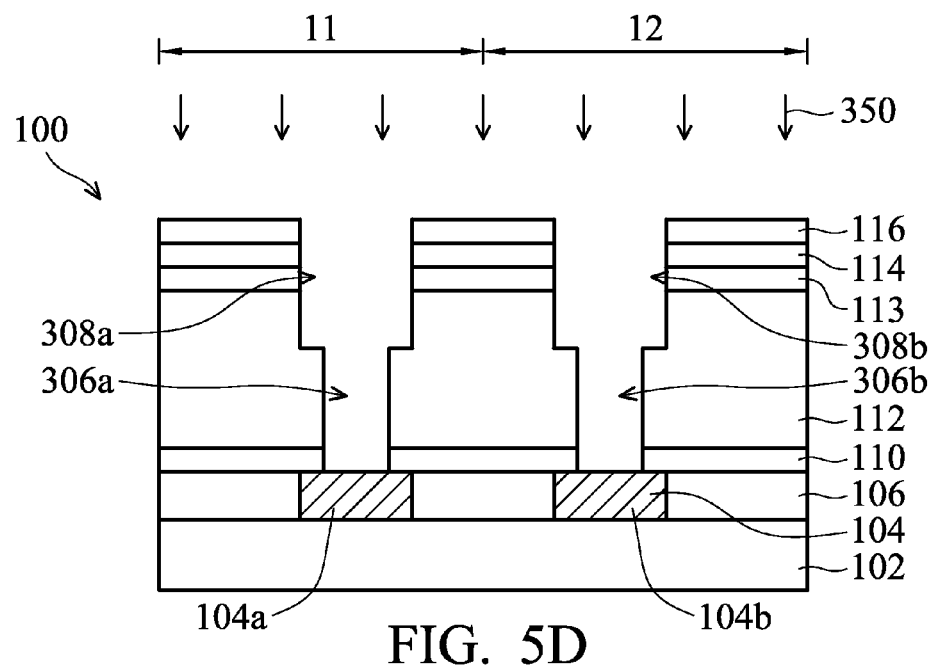

Afterwards, the second dielectric layer 112 and the etching stop layer 110 are etched through by the third etching process 350 as shown in FIG. 5D, in accordance with some embodiments of the disclosure. It should be noted that the first etching process 310, the second etching process 330 and the third etching process 350 are performed in the same chamber.

As shown in FIG. 5D, the first via portion 306a and the first trench 308a are formed in the isolated region 11 and the second via portion 306b and the second trench 308b are formed in the dense region 12.

As mentioned above, the bottom profile of the first via portion 306a in the isolated region 11 may be shrunk due to the loading effect. In order to reduce the loading effect, the trench-via structure is formed by a series of patterning processes including the first etching process 310, the second etching process 330 and the third etching process 350. The first etching process 310 is used to define the pattern of the bottom layer 224 of the second tri-layer photoresist structure 220. The second etching process 330 is used to define the pattern of the second dielectric layer 112 over the first metal layer 104. The third etching process 350 is used to define the pattern of the via portions 306a, 306b and the trench portions 308a, 308b. The bottom profile of the first via portion 106a in the isolated region 11 is improved by controlling the etching parameters of the first etching process 310, the second etching process 330 and the third etching process 350.

Embodiments for forming a semiconductor device structure and method for formation the same are provided. A FinFET structure is formed on a substrate. A contact structure is formed over the FinFET structure. An interconnect structure is formed over the contact structure, and the interconnect structure includes a first metal layer over the contact structure, and a trench-via structure over the first metal layer. The trench-via structure includes a first via portion in an isolated region and a second via portion in the dense region. The bottom profile of the first via portion in the isolated region is improved by the controlling the etching parameters of the first etching process, a second etching process and a third etching process. When the bottom profile of the first via portions is improved, the process window for filling conductive material is also increased. Therefore, the performance of the FinFET device structure is improved.

In some embodiments, a method for forming a semiconductor device structure is provided. The method includes forming a first metal layer over a substrate and forming a dielectric layer over the first metal layer. The method includes forming an antireflection layer over the dielectric layer. The method includes forming a hard mask layer over the antireflection layer and forming a patterned photoresist layer over the hard mask layer. The method includes etching a portion of the antireflection layer by using the patterned photoresist layer as a mask and by performing a first etching process and etching through the antireflection layer and etching a portion of the dielectric layer by performing a second etching process to form openings in the dielectric layer, and the sidewalls of the openings are vertical. The method includes etching through the dielectric layer by performing a third etching process to expose the first metal layer and to form a via portion on the first metal layer. The via portion includes a first sidewall and a second sidewall, and the slope of the first sidewall is different from the slope of the second sidewall.

In some embodiments, a method for forming a semiconductor device structure is provided. The method includes receiving a substrate, and the substrate comprises an isolated region and a dense region. The method includes forming a first metal layer on the substrate, and the first metal layer includes a first portion in the isolated region and a second portion in the dense region. The method also includes forming an etch stop layer over the first metal layer and forming a low-k dielectric layer over the etch stop layer. The method includes forming an antireflection layer over the low-k dielectric layer and forming a hard mask layer over the antireflection layer. The method includes forming a tri-layer photoresist structure over the hard mask layer. The method includes patterning the tri-layer photoresist structure to form a patterned tri-layer structure and patterning the antireflection layer using the patterned tri-layer structure as a mask and by a first etching process. The method includes patterning the low-k dielectric layer by a second etching process and patterning the etch stop layer by a third etching process to form a first via portion above the first metal layer and a second via portion above the second metal layer. The first via portion has a first via width and the second via portion has a second via width, and the first via width is equal to the second via width.

In some embodiments, a method for forming a semiconductor device structure is provided. The method includes forming a FinFET structure over a substrate, and the substrate includes an isolated region and a dense region. The method includes forming an interconnect structure over the FinFET structure, and the interconnect structure includes a first metal layer embedded in a dielectric layer. The method includes forming a low-k dielectric layer over the interconnect structure and forming an antireflection layer over the low-k dielectric layer. The method includes forming a hard mask layer over the antireflection layer and forming a patterned photoresist layer over the hard mask layer. The method includes etching a portion of the antireflection layer by using the patterned photoresist layer as a mask and by performing a first etching process and etching through the antireflection layer and etching a portion of the low-k dielectric layer by performing a second etching process to form the openings in the low-k dielectric layer. The method includes etching through the low-k dielectric layer by performing a third etching process to expose the first metal layer and to form a first via portion on the first metal layer in the isolated region. The first etching process, the second etching process and the third etching process are performed in the same chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first metal layer over a substrate;
    forming an etch stop layer on the first metal layer;
    forming a dielectric layer over the etch stop layer;
    forming an antireflection layer over the dielectric layer;
    forming a hard mask layer over the antireflection layer;
    forming a patterned photoresist layer over the hard mask layer;
    etching a portion of the antireflection layer by using the patterned photoresist layer as a mask and by performing a first etching process;
    etching through the antireflection layer and etching a portion of the dielectric layer by performing a second etching process to form openings in the dielectric layer, wherein the sidewalls of the openings are vertical; and
    etching through the dielectric layer and the etch stop layer by performing a third etching process to expose the first metal layer and to form a via portion on the first metal layer, wherein the via portion comprises a bottom surface, a first sidewall, and a second sidewall, the first sidewall extends between the bottom surface and the second sidewall and is sloped from the second sidewall to the bottom surface, the second sidewall extends upward and vertically from a top of the first sidewall, and the top of the first sidewall is below a top of the etch stop layer.

2. The method for forming the semiconductor device structure as claimed in claim 1, wherein the second etching process is performed by using a second etch gas comprising fluorine-containing gas, carbon-containing gas, nitrogen ($N_2$), oxygen ($O_2$) or combinations thereof, and a ratio (C/F) of carbon to fluorine is in a range from about 1/4 to about 1/2.

3. The method for forming the semiconductor device structure as claimed in claim 1, wherein the third etching process is performed by using a third etch gas comprising fluorine-containing gas, carbon-containing gas, nitrogen ($N_2$), oxygen ($O_2$) or combinations thereof, and a ratio (C/F) of carbon to fluorine is in a range from about 1/4 to about 1/2.

4. The method for forming the semiconductor device structure as claimed in claim 1, wherein the third etch gas further comprises a diluting gas, and a ratio of the flow rate of diluting gas to the flow rate of the third etch gas is in a range from about 20/1 to about 40/1.

5. The method for forming the semiconductor device structure as claimed in claim 1, further comprising:
    forming a FinFET structure on the substrate before forming the first metal layer; and
    forming a contact structure on the FinFET structure, wherein the FinFET structure comprises a source/drain (S/D) structure, and the S/D structure is electrically connected to the first metal layer by the contact structure.

6. The method for forming the semiconductor device structure as claimed in claim 1, wherein the first etching process, the second etching process and the third etching process are performed in the same chamber.

7. The method for forming the semiconductor device structure as claimed in claim 1, further comprising:
    forming a buffer layer between the dielectric layer and the antireflection layer, wherein during the second etching process, an etch rate of the buffer layer is between an etch rate of the antireflection layer and an etch rate of the dielectric layer.

8. A method for forming a semiconductor device structure, comprising:
    receiving a substrate, wherein the substrate comprises an isolated region and a dense region;
    forming a first metal layer on the substrate, wherein the first metal layer includes a first portion in the isolated region and a second portion in the dense region;
    forming an etch stop layer over the first metal layer;
    forming a low-k dielectric layer over the etch stop layer;

forming an antireflection layer over the low-k dielectric layer;

forming a hard mask layer over the antireflection layer;

forming a tri-layer photoresist structure over the hard mask layer;

patterning the tri-layer photoresist structure to form a patterned tri-layer structure;

patterning the antireflection layer using the patterned tri-layer structure as a mask and by a first etching process;

patterning the low-k dielectric layer by a second etching process; and patterning the etch stop layer by a third etching process to form a first via portion above a first portion of the first metal layer and a second via portion above a second portion of the first metal layer, wherein the first via portion has a first via width and the second via portion has a second via width, and the first via width is equal to the second via width, and wherein the first via portion comprises a bottom surface, a first sidewall, and a second sidewall, the first sidewall extends between the bottom surface and the second sidewall and is sloped from the second sidewall to the bottom surface, the second sidewall extends upward and vertically from a top of the first sidewall, and the top of the first sidewall is below a top of the etch stop layer.

9. The method for forming the semiconductor device structure as claimed in claim 8, wherein an upper portion of the first sidewall is adjoined to the low-k dielectric layer and a lower portion of the first sidewall is adjoined to the etch stop layer.

10. The method for forming the semiconductor device structure as claimed in claim 8, wherein the first sidewall tapers gradually toward the bottom surface.

11. The method for forming the semiconductor device structure as claimed in claim 8, wherein a first angle between the bottom surface and the first sidewall is in a range from about 80 degrees to about 90 degrees.

12. The method for forming the semiconductor device structure as claimed in claim 8, wherein the second etching process is performed by using a second etch gas comprising fluorine-containing gas, carbon-containing gas, nitrogen ($N_2$), oxygen ($O_2$) or combinations thereof, and a ratio (C/F) of carbon to fluorine is in a range from about 1/4 to about 1/2.

13. The method for forming the semiconductor device structure as claimed in claim 8, wherein the first etching process, the second etching process and the third etching process are performed in the same chamber.

14. The method for forming the semiconductor device structure as claimed in claim 8, further comprising:

patterning the hard mask layer to form a patterned hard mask layer;

patterning the low-k dielectric layer by the patterned hard mask layer, such that a first trench portion over the first via portion and a second trench portion over the second via portion are formed while performing the third etching process.

15. The method for forming the semiconductor device structure as claimed in claim 14, further comprising:

filling a conductive material into the first via portion, the first trench portion, the second via portion, and the second trench portion to form a first dual damascene structure and a second dual damascene structure.

16. The method for forming the semiconductor device structure as claimed in claim 8, further comprising:

forming a FinFET structure over the substrate before forming the first metal layer; and forming a contact structure over the FinFET structure, wherein the contact structure is electrically connected to the first metal layer.

17. A method for forming a semiconductor device structure, comprising:

forming a FinFET structure over a substrate, wherein the substrate includes an isolated region and a dense region;

forming an interconnect structure over the FinFET structure, wherein the interconnect structure comprises: a first metal layer embedded in a dielectric layer;

forming an etch stop layer on the first metal layer;

forming a low-k dielectric layer over the etch stop layer;

forming an antireflection layer over the low-k dielectric layer;

forming a hard mask layer over the antireflection layer;

forming a patterned photoresist layer over the hard mask layer;

etching a portion of the antireflection layer by using the patterned photoresist layer as a mask and by performing a first etching process;

etching through the antireflection layer and etching a portion of the low-k dielectric layer by performing a second etching process to form the openings in the low-k dielectric layer; and etching through the low-k dielectric layer and the etch stop layer by performing a third etching process to expose the first metal layer and to form a first via portion on the first metal layer in the isolated region, wherein the first etching process, the second etching process and the third etching process are performed in the same chamber, wherein the first via portion comprises a bottom surface, a first sidewall, and a second sidewall, the first sidewall extends between the bottom surface and the second sidewall and is sloped from the second sidewall to the bottom surface, the second sidewall extends upward and vertically from a top of the first sidewall, and the top of the first sidewall is below a top of the etch stop layer.

18. The method for forming the semiconductor device structure as claimed in claim 17, wherein the second etching process is performed by using a second etch gas comprising fluorine-containing gas, carbon-containing gas, nitrogen ($N_2$), oxygen ($O_2$) or combinations thereof, and a ratio (C/F/O) of carbon to fluoride to oxygen is in a range from about 22:44:1 to about 22:88:1.

19. The method for forming the semiconductor device structure as claimed in claim 17, further comprising:

forming a second via portion on the first metal layer in the dense region, wherein the first via portion has a first width, the second via portion has a second width, and the first via width is equal to the second via width.

20. The method for forming the semiconductor device structure as claimed in claim 17, wherein the first sidewall tapers gradually toward the bottom surface.

* * * * *